(12) United States Patent
Bocharov et al.

(10) Patent No.: US 11,010,682 B2
(45) Date of Patent: May 18, 2021

(54) EFFICIENT SYNTHESIS OF PROBABILISTIC QUANTUM CIRCUITS WITH FALLBACK

(71) Applicant: Microsoft Technology Licensing, LLC, Redmond, WA (US)

(72) Inventors: Alexei Bocharov, Redmond, WA (US); Krysta Svore, Seattle, WA (US); Martin Roetteler, Woodinville, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 15/510,668

(22) PCT Filed: Sep. 11, 2015

(86) PCT No.: PCT/US2015/049534
§ 371 (c)(1),
(2) Date: Mar. 10, 2017

(87) PCT Pub. No.: WO2016/040708
PCT Pub. Date: Mar. 17, 2016

(65) Prior Publication Data
US 2017/0220948 A1    Aug. 3, 2017

Related U.S. Application Data

(60) Provisional application No. 62/049,238, filed on Sep. 11, 2014.

(51) Int. Cl.
*G06N 99/00*    (2019.01)
*B82Y 10/00*    (2011.01)
(Continued)

(52) U.S. Cl.
CPC ............. *G06N 10/00* (2019.01); *B82Y 10/00* (2013.01); *G06F 17/10* (2013.01); *G06F 30/00* (2020.01); *G06N 99/00* (2013.01); *Y10S 977/933* (2013.01)

(58) Field of Classification Search
CPC ....... G06N 99/002; G06N 10/00; G06F 17/10
See application file for complete search history.

(56) References Cited

U.S. PATENT DOCUMENTS 8,874,477 B2 * 10/2014 Hoffberg .............. G06Q 10/103
                                                          705/37
10,366,339 B2 *  7/2019 Bocharov ............. G06F 30/327
(Continued)

FOREIGN PATENT DOCUMENTS

CN        103577385 A     2/2014

OTHER PUBLICATIONS

David McMahon, Quantum Computing Explained, 2008, Wiley, Chapters 2, 3, 6, and 8. (Year: 2008).*
(Continued)

*Primary Examiner* — Victoria K. Hall
(74) *Attorney, Agent, or Firm* — Klarquist Sparkman, LLP

(57) ABSTRACT

A Probabilistic Quantum Circuit with Fallback (PQFs) is composed as a series of circuit stages that are selected to implement a target unitary. A final stage is conditioned on unsuccessful results of all the preceding stages as indicated by measurement of one or more ancillary qubits. This final stage executes a fallback circuit that enforces deterministic execution of the target unitary at a relatively high cost (mitigated by very low probability of the fallback). Specific instances of general PQF synthesis method and are disclosed with reference to the specific Clifford+T, Clifford+V and Clifford+π/12 bases. The resulting circuits have expected
(Continued)

cost in $\log_b(1/\varepsilon)+O(\log(\log(1/\varepsilon)))+$const wherein b is specific to each basis. The three specific instances of the synthesis have polynomial compilation time guarantees.

11 Claims, 5 Drawing Sheets

(51) Int. Cl.
  *G06F 17/10* (2006.01)
  *G06N 10/00* (2019.01)
  *G06F 30/00* (2020.01)

(56) References Cited

U.S. PATENT DOCUMENTS

| | | | | |
|---|---|---|---|---|
| 10,430,162 | B2* | 10/2019 | Roetteler | G06F 7/725 |
| 2007/0087756 | A1* | 4/2007 | Hoffberg | G06Q 10/0635 |
| | | | | 455/450 |
| 2011/0047201 | A1 | 2/2011 | Macready et al. | |
| 2011/0153257 | A1 | 6/2011 | Ishizaka | |
| 2014/0026107 | A1 | 1/2014 | Bocharov et al. | |
| 2014/0264288 | A1 | 9/2014 | Svore et al. | |
| 2014/0280427 | A1 | 9/2014 | Bocharov et al. | |
| 2015/0106418 | A1 | 4/2015 | Kliuchnikov et al. | |
| 2017/0032272 | A1 | 2/2017 | Bocharov et al. | |

OTHER PUBLICATIONS

G. J. Borse, Fortran 77 and Numerical Methods for Engineers, 1985, PWS Publishers, Section 4.5, Chapters 11 and 12. (Year: 1985).*
Bocharov et al., "Efficient synthesis of universal repeat-until-success circuits," available at: http://arxiv.org/pdf/1404.5320v1.pdf, pp. 1-16 (Apr. 21, 2014).
Bocharov et al., "Efficient synthesis of probabilistic quantum circuits with fallback," available at: http://arxiv.org/pdf/1409.3552v2.pdf, pp. 1-17 (Sep. 19, 2014).
Bravyi et al., "Magic state distillation with low overhead," available at: http://arxiv.org/pdf/1209.2426v1.pdf, pp. 1-11 (Sep. 11, 2012).
Ferguson et al., "A Polynomial Time, Numerically Stable Integer Relation Algorithm," RNR Technical Report RNR-91-032, pp. 1-14 (Jul. 14, 1992).
Giles, "Exact Synthesis of Quantum Circuits," available at: http://www.mta.ca/~gcruttwell/FMCS2013Slides/brettGiles.pdf (Jun. 1, 2013).
Giles et al., "Remarks on Matsumoto and Amano's normal form for single-qubit Clifford+T operators," available at: http://arxiv.org/pdf/1312.654v1.pdf, pp. 1-13 (Dec. 23, 2013).
Gingrich et al., "Non-Unitary Probabilistic Quantum Computing," Proceedings of the Winter International Symposium on Information and Communication Technologies, 6 pages (Jan. 5, 2004).
International Search Report and Written Opinion from International Application No. PCT/US2015/049534, dated Feb. 3, 2016, 14 pages.
Kliuchnikov, "Synthesis of unitaries with Clifford+T circuits," available at: http://arxiv.org/pdf/1306.3200v1.pdf, pp. 1-4 (Jun. 13, 2013).
Kliuchnikov et al., "Asymptotically optimal approximation of single qubit unitaries by Clifford and T circuits using a constant number of ancillary qubits," available at: http://arxiv.org/pdf/1212.0822v2.pdf, pp. 1-5 (Dec. 6, 2012).
Kliuchnikov et al., "Fast and efficient exact synthesis of single-qubit unitaries generated by Clifford and T gates," Quantum Information and Computation, 13:0607-0630 (Jul. 2013).
Massey, "Searching for Quantum Software," Thesis, University of York, Department of Computer Science, 171 pages (Aug. 2006).
Massey et al., "Evolving quantum circuits and programs through genetic programming," Proceedings of Genetic and Evolutionary Computation Conference, 12 pages (Jun. 24, 2004).
Matsumoto et al., "Representation of quantum circuits with Clifford and π/8 gates," Quantum Physics (quant-ph), 2 pages (Jun. 24, 2008).

Meier et al., "Magic-state distillation with the four-qubit code," available at: http://arxiv.org/pdf/1204.4221v1.pdf, pp. 1-10 (Apr. 18, 2012).
Nielsen et al., "Quantum Computation and Quantum Information," *Cambridge University Press*, 698 pages (Dec. 9, 2000).
Paetznick et al., "Repeat-until-success: Non-deterministic decomposition of single-qubit unitaries," available at: http://arxiv.org/pdf/1311.1074v1.pdf, pp. 1-24 (Nov. 5, 2013).
Paler et al., "Software-based Pauli Tracking in Fault-Tolerant Quantum Circuits," Conference on Design, Automation and Test in Europe, 4 pages (Mar. 24, 2014).
Roetteler, "Quantum Algorithms I—New circuit synthesis methods," available at: http://www.uoguelph.ca/quigs/cssqi14/Slides/Roetteler_I.pdf, 64 pages (Jun. 20, 2014).
Ross et al., "Optimal ancilla-free Clifford+T approximation of z-rotations," available at: http://arxiv.org/pdf/1403.2975v1.pdf, pp. 1-36 (Mar. 12, 2014).
Selinger, "Efficient Clifford+T approximation of single-qubit operators," available at: http://arxiv.org/pdf/1311.1074v1.pdf, pp. 1-17 (Jul. 29, 2014).
Shah et al., "Ancilla driven quantum computation with arbitrary entangling strength," available at: http://arxiv.org/pdf/1303.2066v1.pdf, pp. 1-19 (Mar. 8, 2013).
Shende et al., "Synthesis of quantum logic circuits," available at: http://arxiv.org/pdf/0406176v5.pdf, pp. 1-19 (Apr. 18, 2006).
Terashima et al., "Nonunitary quantum circuit," available at: http://arxiv.org/pdf/0304061v5.pdf, pp. 1-19 (Apr. 6, 2005).
"User's Guide to PARI / GP," available at: http://pari.math.u-bordeaux.fr/pub/pari/manuals/2.5.1/users.pdf, retrieved on: Aug. 28, 2014 277 pages.
Wiebe et al., "Floating point representations in quantum circuit synthesis," New Journal of Physics, 15:1-24 (Sep. 2013).
Wiebe et al., "Quantum arithmetic and numerical analysis using Repeat-Until-Success circuits," available at: http://arxiv.org/pdf/1406.2040v2.pdf, pp. 1-32 (Jun. 19, 2014).
Written Opinion of the International Preliminary Examining Authority from International Application No. PCT/US2015/049534, dated Jul. 29, 2016, 8 pages.
"Non-Final Office Action Issued in U.S. Appl. No. 15/302,887", dated Jan. 25, 2018, 6 Pages.
"Office Action Issued in European Patent Application No. 15716361.9", dated Mar. 23, 2018, 8 Pages.
"Office Action and Search Report Issued in Chinese Patent Application No. 201580018860.0", dated May 3, 2018, 13 Pages.
Bocharov, et al., "A Depth-Optimal Canonical Form for Single-qubit Quantum Circuits", Published on: Jun. 14, 2012 Available at: http://arxiv.org/pdf/1206.3223.pdf, Jun. 14, 2012, 10 Pages.
Bocharov, et al., "Efficient Decomposition of Single-Qubit Gates into V Basis Circuits", In Physical Review A, vol. 88, 012313, Jul. 12, 2013, 15 Pages.
Giles, et al., "Exact synthesis of multiqubit Clifford+T circuits", In Journal of Physical Review vol. 87, Issue 3, Mar. 26, 2013, 7 Pages.
Halil-Shah et al, "A Minimum Control Ancilla Driven Quantum Computation Scheme with Repeat-Until-Success Style Gate Generation", http://arxiv.org/pdf/1401.8004.pdf, Jan. 30, 2014.
Kliuchnikov, et al., "Practical approximation of single-qubit unitaries by single-qubit quantum Clifford and T circuits", https://arxiv.org/pdf/1212.6964.pdf, Mar. 13, 2014, 11 Pages.
Lim et al, "Repeat-Until-Success Quantum Computing", http://arxiv.org/pdf/quant-ph/0408043v4.pdf, Feb. 1, 2008, 5 Pages.
"International Search Report & Written Opinion Issued in PCT Application No. PCT/US2015/023757", dated Nov. 11, 2015, 14 Pages.
Bocharov, et al., "Efficient Synthesis of Universal Repeat-Until-Success Circuits", Apr. 21, 2014, available online at arXiv:1404.5320v1 [quant-ph].
Second Office Action from Chinese Patent Application No. 201580018860.0, dated Nov. 8, 2018, 7 pages (with English translation).
First Office Action and Search Report from Chinese Patent Application No. 201580048928.X, dated Oct. 25, 2019, 13 pages.

(56) References Cited

OTHER PUBLICATIONS

Summons to attend oral proceedings pursuant to Rule 115(1) EPC from European Patent Application No. 15716361.9, dated May 18, 2020, 6 pages.
Second Office Action issued in Chinese Patent Application No. 201580048928.X, dated Jul. 15, 2020, 15 pages (with English translation).

* cited by examiner

US 11,010,682 B2

EFFICIENT SYNTHESIS OF PROBABILISTIC QUANTUM CIRCUITS WITH FALLBACK

CROSS REFERENCE TO RELATED APPLICATIONS

This is the U.S. National Stage of International Application No. PCT/US2015/049534, filed Sep. 11, 2015, which was published in English under PCT Article 21(2), which in turn claims the benefit of U.S. Provisional Application No. 62/049,238, filed Sep. 11, 2014. The provisional application is incorporated herein in its entirety.

FIELD

The disclosure pertains to quantum circuit design.

BACKGROUND

With rapid maturation of quantum devices, efficient compilation of high-level quantum algorithms into lower-level fault-tolerant circuits is critical. A plurality of useful fault-tolerant quantum basis sets arises from augmenting the set of Clifford gates by one or more unitary gates in order to make the gate set universal. Examples comprise the Clifford+T basis, consisting of the two-qubit controlled-NOT gate (CNOT) and the single-qubit Hadamard gate (H) as generators for the Clifford gates, along with the T gate, implementing a relative phase of $e^{i\pi/4}$, the Clifford–$\pi/12$ basis, consisting of said CNOT and H gates, along with a single qubit unitary that implements a relative phase of $e^{\pi}/12$ and the Clifford+V basis, consisting of said CNOT and H gates, along with 6 gates that are defined over the cyclotomic integers Z[i].

Efficient algorithms for approximating a single-qubit gate into each of the universal gate sets Clifford+T and Clifford+V are available, and the resulting number of elementary gates that are outside the Clifford group has scaling that is close, but slightly larger than an information-theoretic lower bound. These algorithms are described in N. Ross and P. Selinger, "Optimal ancilla-free Clifford+T approximation of z-rotations," published on the Internet at http://arxiv.org/abs/1403.2975 (2014), and Kliuchnikov et al., "Practical approximation of single-qubit unitaries by single-qubit quantum Clifford and T circuits," published on the Internet at http://arxiv.org/abs/1212.6964 (2012), both of which are incorporated herein by reference. Clifford and V circuit decompositions are described in Bocharov et al., "Efficient Decomposition of Single-Qubit Gates into V Basis Circuits," available on the Internet at arXiv:1303.1411, which is incorporated herein by reference.

For the Clifford+T gate set, so-called Repeat-Until-Success (RUS) circuits have been proposed that can further reduce the expected number of required elementary gates for both axial and non-axial rotations to make it come even closer to the information-theoretic lower bound. An RUS circuit allows a potentially unlimited sequence of trial and correction cycles with finite expected cost below the lower bound achieved by a purely unitary circuit design. However, alternative approaches are needed that can reduce the number of gates as well as guarantee success after a predetermined number of cycles. At the same time, alternative approaches are needed that can be applied for more general gate sets beyond Clifford+T, so that synthesis for more general sets of gate sets becomes tractable at increased efficiency.

SUMMARY

Probabilistic quantum circuits with fallback (PQFs) include a series of multi-qubit stages that are configured to have a probability of producing a target rotation based on an input associated with an output of an unsuccessful previous stage in the series. Each stage may or may not be successful. A deterministic fallback quantum circuit is coupled to a final stage and produces the target rotation based on the output of the final stage. The stages are implemented in the Clifford+T, Clifford+$\pi/12$, or the Clifford+V bases.

In one example, a computer-implemented method of defining a quantum circuit comprises establishing a first approximation of a target single-qubit unitary to a requested precision. The first approximation is expanded into a first multi-qubit unitary that implements the target single-qubit unitary in a selected basis upon successful measurement. The fallback circuit deterministically implements the target unitary conditional upon unsuccessful measurements in all previous stages. A circuit definition is output that includes a definition of the sequence of multi-qubit unitaries for all intermediate stages and a definition of the fallback circuit. Each intermediate stage is followed by measurement of at least one ancillary qubit, and if the measurement indicates that the stage was unsuccessful, then the next stage is executed, and so on. If measurement of a particular stage indicates success, the additional stages and the fallback circuit are not needed. If measurements of all intermediate stages indicate that all intermediate stages are unsuccessful, the fallback circuit is applied.

DETAILED DESCRIPTION

Figure 1:
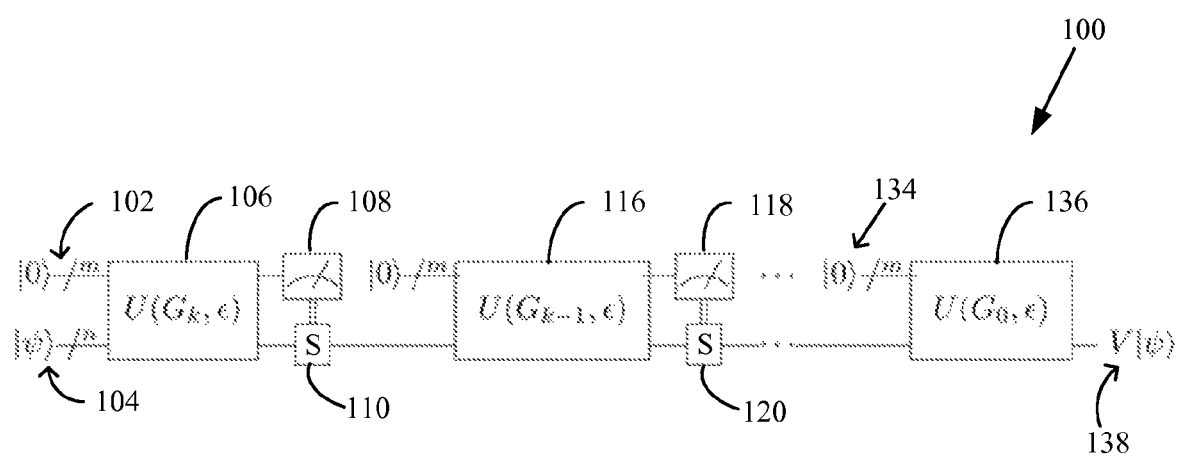
FIG. 1 illustrates a representative PQF circuit.

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatus' are referred to as "lowest", "best", "minimum," or the like. It will be appreciated that such descriptions are intended to indicate that a selection among many used functional alternatives can be made, and such selections need not be better, smaller, or otherwise preferable to other selections.

In some examples, the terms "unitary" or "unitary matrix" are used to refer to functions performed by quantum circuits that can be implemented in a variety of ways. In the following description, such matrices are also referred to as circuits for convenient description. Some commonly used unitary quantum gates corresponding to single-qubit operators S, X Y, and Z can be represented as:

$$S = \begin{bmatrix} 1 & 0 \\ 0 & i \end{bmatrix}$$

$$X = \begin{bmatrix} 0 & 1 \\ 1 & 0 \end{bmatrix},$$

$$Y = \begin{bmatrix} 0 & -i \\ i & 0 \end{bmatrix},$$

$$Z = \begin{bmatrix} 1 & 0 \\ 0 & -1 \end{bmatrix}.$$

Compilation of high-level quantum algorithms into lower-level fault-tolerant circuits is a critical component of quantum computation. One fault-tolerant universal quantum basis, referred to as the Clifford+T basis, consists of the two-qubit Controlled-NOT gate (CNOT), and two single-qubit gates, the Hadamard gate (H) and the T-gate T. The operation of these gates can be written as:

$$CNOT = \begin{pmatrix} 1 & 0 & 0 & 0 \\ 0 & 1 & 0 & 0 \\ 0 & 0 & 0 & 1 \\ 0 & 0 & 1 & 0 \end{pmatrix}$$

$$H = \frac{1}{\sqrt{2}} \begin{bmatrix} 1 & 1 \\ 1 & -1 \end{bmatrix}, \text{ and}$$

$$T = \begin{bmatrix} 1 & 0 \\ 0 & e^{i\frac{\pi}{4}} \end{bmatrix}.$$

Other bases can be used as well, including the Clifford+$\pi/12$ and Clifford+V bases.

For the Clifford+$\pi/12$ basis we augment the set of Clifford gates by the gate $$\begin{bmatrix} 1 & 0 \\ 0 & e^{i\pi/6} \end{bmatrix}.$$

For the Clifford+V basis we augment the set of Clifford gates by the 6 gates $V_1, V_2, V_3, V_1^{-1}, V_2^{-1}, V_3^{-1}$ that are defined as follows:

$$V_1 = \frac{1}{\sqrt{5}}(I + 2iX), \quad V_1^{-1} = \frac{1}{\sqrt{5}}(I - 2iX),$$

$$V_2 = \frac{1}{\sqrt{5}}(I + 2iY), \quad V_2^{-1} = \frac{1}{\sqrt{5}}(I - 2iY),$$

$$V_3 = \frac{1}{\sqrt{5}}(I + 2iZ), \quad V_3^{-1} = \frac{1}{\sqrt{5}}(I - 2iZ).$$

Basis circuits can be combined to implement an arbitrary unitary operation. A one-qubit unitary operator can be expressed as a unitary 2×2 matrix with complex elements:

$$\begin{bmatrix} a & b \\ -b^* & a^* \end{bmatrix},$$

wherein a and b are complex numbers and the notation "x*" indicates a complex conjugate of x. Such a unitary 2×2 matrix U has the following property:

$$U^\dagger U = UU^\dagger = I = \begin{bmatrix} 1 & 0 \\ 0 & 1 \end{bmatrix},$$

wherein $$U^\dagger = \begin{bmatrix} a^* & -b \\ b^* & a \end{bmatrix}.$$

The adjoint $U^\dagger$ of a unitary matrix U is the complex-conjugate transpose of the unitary U and is the inverse of U, denoted $U^{-1}$.

In the following, multi-qubit circuits are disclosed that have one or more qubits that are used to obtain computed values associated with one or more unitaries and one or more qubits that are used to determine success or failure of a circuit or sub-circuit. These qubits are referred to as primary qubits and ancillary qubits (or ancilla), respectively. In most examples, ancillary qubits are initialized to the zero state for convenience, but other initial states can be used. PQF circuits typically include a series of stages, and the circuits for these stages are referred to in some examples as sub-circuits. A PQF circuit generally includes a number of sub-circuits and a fallback circuit that is associated with a final sub-circuit. As noted above, each intermediate stage in the series is followed by measurement of at least one ancillary qubit, and if the measurement indicates that the stage was unsuccessful, then the next stage is executed, and so on. If measurement of a particular stage indicates success, the additional stages and the fallback circuit are not needed.

If measurements of all intermediate stages indicate that all intermediate stages are unsuccessful, the fallback circuit is applied.

For convenient illustration, the examples below pertain to PQF implementation of single-qubit gates. Multi-qubit gates can be implemented as PQF circuits in the same manner. In addition, while implementation examples are shown in particular bases, other bases can be used. Generally, any basis in which a deterministic fallback circuit can be defined is suitable for PQF circuit implementation. In addition to the PQF circuits and methods, the following describes generation of deterministic fallback circuits in the Clifford+$\pi$/12 basis.

A unitary operation is representable by a Clifford+T circuit if and only if the unitary operation is represented by a unitary matrix of the form $1/\sqrt{2}^k U$ wherein U is a matrix with elements from $\mathbb{Z}[\omega]$ and k is a non-negative integer. $\mathbb{Z}[\omega]$ is a ring of cyclotomic integers of order 8, and consists of all numbers of the form $a\omega^3+b\omega^2+c\omega+d$ wherein a,b,c,d are arbitrary integers and $\omega=e^{i\pi/4}$. One choice for a basis of $\mathbb{Z}[\omega]$ is $\{\omega^3, \omega^2, \omega, 1\}$. To be unitary, $UU^\dagger=2^k\text{Id}$, where Id is an identity matrix. A matrix of such form can be represented as an asymptotically optimal Clifford+T circuit using at most two ancillary qubits, no ancillary qubits are required for a single-qubit subject unitary or when $\text{Det}(1/\sqrt{2}^k U)=1$. Any single-qubit circuit in the {H,T} basis can be expressed as a sequence of syllables of the form $T^{-k}HT^k, k\in\mathbb{Z}$ and at most one additional single-qubit Clifford gate. Any single-qubit unitary operation U can be decomposed into a sequence of axial rotations $U=R_z(\alpha) R_x(\beta) R_z(\gamma)$ in accordance with the Euler angle decomposition of U. Thus any single-qubit unitary operation can be decomposed into Clifford+T circuits using the techniques presented herein. Similar single-qubit circuit decompositions can be Clifford+V circuits or Clifford+$\pi$/12 circuits.

Disclosed herein are quantum circuits and methods based on probabilistic circuits with fallback (PQFs) that allow a finite (typically, small) number of trials and only one final correction step that is purely unitary and may have a considerable cost. The expected cost for a PQF circuit is lower than other decomposition techniques due to the probability boosting that decreases the probability of having to perform the costly fallback sub-circuit being extremely low. The synthesis of a PQF circuit approximating a given target can be simpler than in the RUS case as in the synthesis of the RUS circuits, considerable effort is directed to maintaining essentially cost-free corrections, for example corrections that are composed of Pauli gates or Clifford gates.

In the following, it is assumed that a so-called "fallback" circuit synthesis method is available that, for a given unitary target gate G and a desired precision $_\varepsilon$ generates a deterministic $_\varepsilon$-approximation circuit F (G,$\varepsilon$) with a known execution cost $C_F(G,\varepsilon)$. In addition, it is assumed that there is a "primary" circuit synthesis method that given G and $_\varepsilon$ generates a probabilistic circuit P (G, $\varepsilon$) with probability p>0 and performs some other unitary gate $G_1$ with probability 1−p. A measurement of one or more ancilla qubits is used to determine whether the primary circuit is successful, i.e., provides an output corresponding to the target gate (e.g., G), or unsuccessful, i.e., provides an output corresponding to the other unitary gate (e.g., $G_1$). A number of stages can be selected based on a cost estimate in view of costs associated with implementation of one or more gates from a basis set. In addition, the number of stages can be selected based on cost so as to avoid including stages that provide little cost benefit and so as to minimize the expected cost of the complete PQF circuit.

In addition to the Clifford+T basis, some examples are based on the Clifford+V basis and the Clifford+$\pi$/12 basis. The Clifford+V basis provides for shortest known unitary circuits resulting from the classically efficient approximate synthesis. The Clifford+$\pi$/12 basis is useful for architectures based on metaplectic anyons. PQF syntheses are disclosed for these bases using the fact that all the exactly representable unitaries over a respective basis are representable as unitarizations of matrices over rings of cyclotomic integers of order 4m,m $\in$1,2,3, wherein m=1 for the Clifford+V basis, m=2 for the Clifford+T basis, and m=3 for the Clifford+$\pi$/12 basis. As noted above, Clifford+T circuits are based on cyclotomic integers of order 8, i.e., 4m, wherein m=2.

For a multi-round PQF design with k rounds, sub-circuits are sequentially generated for each round. Each subsequent round of the design is conditional on the failure of all the previous rounds, and accounts for cumulative undesired outcomes of the previous rounds. In what follows a PQF circuit is designed for a target z-rotation such that the undesired outcomes are also z-rotations. With this, each round of the PQF design will have the same logic and only the target rotation angles between the rounds may be different.

A representative PQF circuit 100 is shown in FIG. 1. One or more ancillary qubits 102 and one or more input (or primary) qubits 104 are coupled to a first stage circuit 106 that implements a unitary $U(G_k,\varepsilon)$. As shown in FIG. 1,111 ancillary qubits and n input qubits are provided. A measurement circuit 108 evaluates an output state associated with the ancillary qubits. A first state classical switch circuit S 110 is coupled to the first stage circuit 106 so as to output qubit values corresponding to processing of the input qubits 104. The first stage classically controlled switch 110 selectively couples the processed input qubits to a second stage circuit 116 if the measured result is unfavorable. If the first stage circuit 106 is successful, a desired output V|$\psi$⟩ is provided, and any additional stages such as the second stage circuit 116 are not required.

The second stage circuit 116 implements a unitary U(G k−1, $\varepsilon$) and is coupled to a measurement circuit 118 and a second stage classically controlled switch 120. As with the first stage circuit 106, the second stage classically controlled switch 120 allows the PQF circuit 100 to continue in additional stages if and only if a measurement result obtained by the measurement circuit 118 is unfavorable. If the result is favorable, the second stage classically controlled switch 120 couples the processed input qubits to provide the desired output V|$\psi$⟩. Additional stages can be provided, but are not shown in FIG. 1.

A fallback circuit 136 is coupled to the input qubits as processed by circuit stages 106, 116 (and other stages) and to ancilla qubits 134. The fallback circuit 136 implements the unitary $U(G_0,\varepsilon)$ and produces the output V|$\psi$⟩ 138.

Let $F_j$|input⟩ be an undesired result of a j-th round of processing as would be signaled by an unfavorable measurement result during execution. Then $G_{j-1}=G_jF_j^\dagger$ and all $G_j$, j=0, . . . , k−1 are computed at compile time.

While additional circuits such as circuits 106, 116 can be provided, in most cases the number k of rounds that need to be applied until the target gate G is implemented is quite small, i.e., only a few such circuits are necessary to achieve nearly optimal performance, typically between 2 and 5 circuits. In both PQF and RUS circuit designs, a unitary operation(s) U is synthesized to act on n+m qubits, of which n are target qubits and in are ancillary qubits. A key difference is that in PQF designs, the unitary may vary from round to round, while it stays the same in RUS designs.

PQF Design Method Overview

Figure 2:
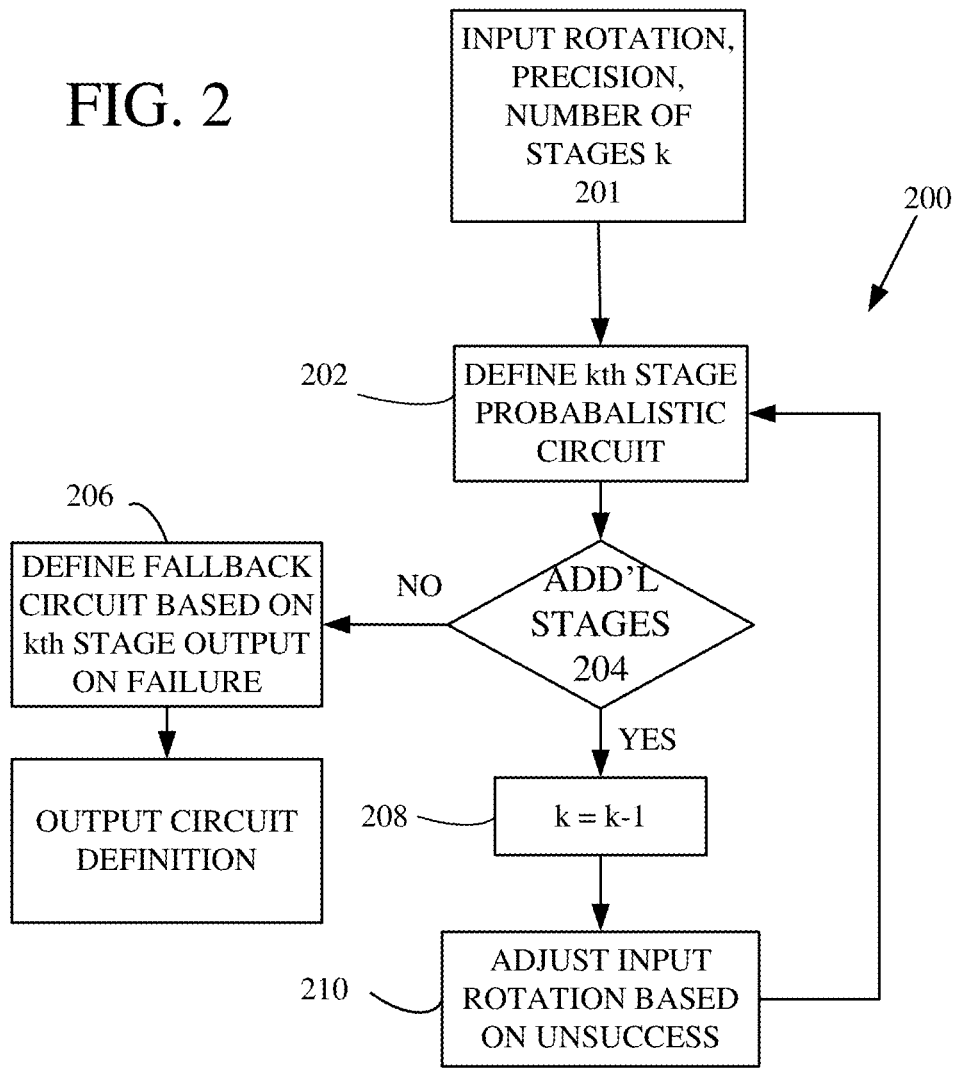
FIG. 2 illustrates a representative method of defining a PQF circuit.

Referring to FIG. 2, a representative circuit design method 200 includes obtaining an input rotation, circuit precision, and a number of stages k at 201. At 202, an implementation of a target unitary is obtained such that the implementation has a probability of success and failure. At 204, it is determined if additional stages are needed. If not, at 206, a fallback circuit is defined based on the kth stage failure. If additional stages are selected, at 208, a counter is decremented, and at 210, an input to a next (k-1) stage is obtained based on the failure of the kth stage. Additional stages are then determined in the same manner.

Determination of a kth stage is described in detail below. In general, a phase factor $e^{i\theta}$ is expressed as a unimodal cyclotomic rational $(z/z^*)$, wherein $z \in \mathbb{Z}[\omega]$ by finding an approximate solution of an integer relation problem. In a next step, several rounds of modification $z \mapsto (rz)$ wherein $r \dagger \mathbb{Z}[92]$ so that a unitary can be expressed using a set of cyclotomic integers based on a basis in which the PQF circuit is to be implemented. In general, this modification is carried out so that (a) a norm equation $|y|^2 = 2^L - |rz|^2$ is solvable for $y \in \mathbb{Z}[\omega], L \in \mathbb{Z}$ and (b) the one-round success probability $|rz|^2/2^L$ is sufficiently close to 1. In a next step, the two-qubit matrix corresponding to the unitary part of the PQF sub-circuit is assembled and during a final step, a two-qubit PQF sub-circuit is synthesized.

Phase Factor Approximation by Cyclotomic Rationals

For any basis, the elements of a unitary U to be synthesized are selected from a suitable set of cyclotomic integers. Let $\zeta = e^{2\pi i/m}$ be the m-th primitive root of unity and consider the corresponding ring of cyclotomic integers $\mathbb{Z}[\zeta]$. An arbitrary phase factor can be represented by a unimodal cyclotomic rational $z^*/z$ wherein $z \in \mathbb{Z}[\zeta]$ as discussed below.

Let $\theta$ be a real angle, so that $|z^*/z - e^{i\theta}| = 2|\text{Im}(ze^{i\theta/2})|/|z|$. The phase factor $e^{i\theta}$ is representable exactly as $z^*/z$ if and only if $\text{Im}(ze^{i\theta/2}) = 0$. This factor is approximately so representable at absolute precision $\varepsilon$ if and only if $|2\text{Im}(ze^{i\theta/2})| < \varepsilon|z|$. Consider the standard integer basis $\{1, \zeta, \ldots, \zeta^{d-1}\}$ in $\mathbb{Z}[\zeta]$. Represent z in this basis, as $z = a_0 + a_1\zeta + \ldots + a_{d-1}\zeta^{d-1}$ wherein $\{a_0, a_1, \ldots, a_{d-1}\}$ are ordinary integers. By direct complex expansion, $\text{Im}(ze^{i\theta/2})$ is a linear form with real coefficients in $\{a_0, a_1, \ldots, a_{d-1}\}$. This form can be expanded as $F(a, x(\theta)) = a_0 x_0(\theta) + a_1 x_1(\theta) + \ldots + a_{d-1} x_{d-1}(\theta)$, wherein $x_j(\theta) = \sin(\theta/2 + 2\pi j/m)$, $j = 0, \ldots, d-1$ is the corresponding real vector. For $\theta$ in general, this vector does not have zero components. It is also helpful to observe that for $|\theta| < \pi/2$ at least one of $x_j$ is well separated from zero (e.g. at least one $x_j(\theta)$ is greater than $\sin(2\pi/m)$).

Representing the phase factor $e^{i\theta}$ exactly as cyclotomic rational is equivalent to solving an integer relation with real coefficients $F(a, x(\theta)) = 0$ for a. Furthermore, when this relation is not solvable, an approximate integer relation is solved, i.e., $\{a_0, a_1, \ldots, a_{d-1}\}$ is found such that $F(a, x(\theta)) | < \delta$. Such approximate relations can be found for arbitrarily small positive $\delta$.

In order to find these solutions, the PSLQ integer relation algorithm can be used. An initial approximation of $e^{i\theta}$ is obtained such that $z^*/z \sim e^{i\theta}$, wherein z is a cyclotomic integer. For a selected real $\theta$ and a cyclotomic integer $z = a\omega^3 + b\omega^2 + c\omega + d, a,b,c,d \in \mathbb{Z}, |z^*/z - e^{i\theta}| < \varepsilon$ if and only if: $|a(\cos(\theta/2) - \sin(\theta/2)) + b\sqrt{2} \cos(\theta/2) + c(\cos(\theta/2) + \sin(\theta/2)) + d\sqrt{2} \sin(\theta/2)| < \varepsilon|z|$.

Thus $e^{i\theta}$ is representable exactly only if $\varepsilon|z| = 0$. If $\varepsilon|z|$ is small, then $|z^*/z - e^{i\theta}|$ is small as well. An integer relation algorithm can be used to find a relation between a set of real numbers $x_1, \ldots, x_n$ and a candidate vector defined by a set of integers $a_1, \ldots, a_n$, not all zero, such that:

$$a_1 x_1 + \ldots + a_n x_n = 0.$$

Most commonly an integer relation algorithm makes iterative attempts to find an integer relation until the size of the candidate vector $a_1, \ldots, a_n$ exceeds a certain pre-set bound or $a_1 x_1 + \ldots + a_n x_n$ falls below a selected resolution level. Such an algorithm can be used to reduce the size of $a_1 x_1 + \ldots + a_n x_n$ to an arbitrarily small value.

The PSLQ algorithm is described in, for example, Helaman R. P. Ferguson and David H. Bailey, "A Polynomial Time, Numerically Stable Integer Relation Algorithm," RNR Technical Report RNR-91-032 (Jul. 14, 1992), which is incorporated herein by reference. As noted above, upon termination, the algorithm provides the integer relation candidate vector $a_1, \ldots, a_n$ for the integer relation $a.x = a_1 x_1 + \ldots + a_d x_d$ such that $|a,x|$ can be made arbitrarily small after a large enough number of iterations. In the examples disclosed herein, iterations terminate when the equivalent of the $|z^*/z - e^{i\theta}| < \varepsilon$ inequality is satisfied.

In the disclosed examples, the cases $m = 4, 8, 12$ are considered, which correspond to the Clifford+V, Clifford+T, and Clifford+$\pi/12$ bases respectively.

Probability Modifier

Let $\zeta = e^{2\pi i/m}$ and limit the analysis to m that is a multiple of 4 (so that the ring $\mathbb{Z}[\zeta]$ contains $i = \sqrt{-1}$). Define a unitarization base $v: v = \sqrt{5}$ for $m > 4$ and $v = \sqrt{5}$ for $m = 4$ (the latter for the Clifford+V basis). Let $\theta$ be the target angle of rotation and $z^*/z, z \in \mathbb{Z}[\zeta]$ be an $\varepsilon$-approximation of the phase factor $e^{i\theta}$. The synthesis of both purely unitary and measurement-assisted circuits around $z^*/z$ hinges on the existence of a unitary matrix of the form $$\frac{1}{v^L}\begin{bmatrix} z & y \\ -y^* & z^* \end{bmatrix},$$

wherein $y \in \mathbb{Z}[\zeta], L \in \mathbb{Z}$.

The corresponding matrix $$\frac{1}{v^{L_r}}\begin{bmatrix} rz & y \\ -y^* & rz^* \end{bmatrix}$$

can be determined by solving the norm equation $|y|^2 = v^{2L_r} - |rz|^2$ for $y \in \mathbb{Z}[\zeta]$. This equation is referred to as a norm equation over the cyclotomic integers, and its solutions are well known. In some cases, this norm equation can be referred to as easily solvable when an integer $N(v^{2L_r} - |rz|^2)$ is easy to factor and the norm equation has a solution. The exact form of the norm equation depends on the selected basis. For the case of $\zeta = i$ (which corresponds to $m = 4$), any phase factor $e^{i\theta}$ can be approximated with a Gaussian rational $z^*/z, z \in \mathbb{Z}[i]$ wherein $|z|$ is in $O(\varepsilon^{-1/2})$.

PQF Circuit Design

As a result of the previous stages, a unitary matrix such as $$V = \frac{1}{\sqrt{5}^{L_r}} \begin{bmatrix} rz & y \\ -y^* & rz^* \end{bmatrix}$$

is available, wherein $L_r = j \log_5(r^2|z|^2)k \leq \log_5(|z|^2) + O(\log(\log_5(|z|^2)))$ and $r^2|z|^2/5^{L_r} > 1 - 1/\log_5(|z|^2)$. V is exactly represented by a unitary Clifford+V circuit with V-count of at most $L_r$. The two-qubit PQF matrix $U = CNOT(I \otimes V)CNOT$ is exactly represented by a circuit with the same V-count.

By direct computation, when U is applied to $|\psi\rangle|0\rangle$ and the second qubit is measured, then:

(0) on measurement result 0, the $\Lambda(z^*/z) \sim \Lambda(e^{i\theta})$ rotation gate is effectively applied to the primary qubit wherein $\Lambda(*)$ is a rotation about the z-axis by an angle $*$; and (1) on measurement result 1, the $\Lambda(-y/y^*)$ rotation gate is applied to the primary qubit, wherein $\Lambda(*)$ is a rotation about the z-axis by an angle $*$. Thus the level one fallback circuit must be a unitary $\varepsilon$-approximation of the rotation gate $\Lambda(-y^*/ye^{i\theta})$. Fallback circuits at subsequent levels have similar structure.

Given a unitary matrix V that is determined as described above, a two-qubit unitary $$U = CNOT(I \otimes V)CNOT = \begin{bmatrix} V & 0 \\ 0 & XVX \end{bmatrix}$$

is constructed. Denote the primary input state for the round as $|\psi\rangle$. The subcircuit for the round uses the first qubit as primary and the second qubit, which is initialized to $|0\rangle$ as ancillary. The unitary U is then applied to the initial state $|\psi\rangle \otimes |0\rangle$ and the (ancillary) second qubit is measured in the computational basis. When the measurement result is 0, then the primary output is reduced to $$\begin{bmatrix} 1 & 0 \\ 0 & z^*/z \end{bmatrix}|\psi\rangle$$

which is the desired $\varepsilon$-approximation of $R_z(\theta)$. When the measurement result is 1, then the primary output is reduced to $$\begin{bmatrix} 1 & 0 \\ 0 & -y/y^* \end{bmatrix}|\psi\rangle.$$

Unless $-y/y^*$ is $\varepsilon$-close to $e^{i\theta}$ the tail end of the PQF protocol now has to implement the rotation $R_z(\theta')$ so that $\theta' = \theta - \arg(-y/y^*)$ is the target rotation for the next round of the PQF protocol. If more than one round is desired, this procedure is repeated for the angle $\theta'$.

Figure 3:
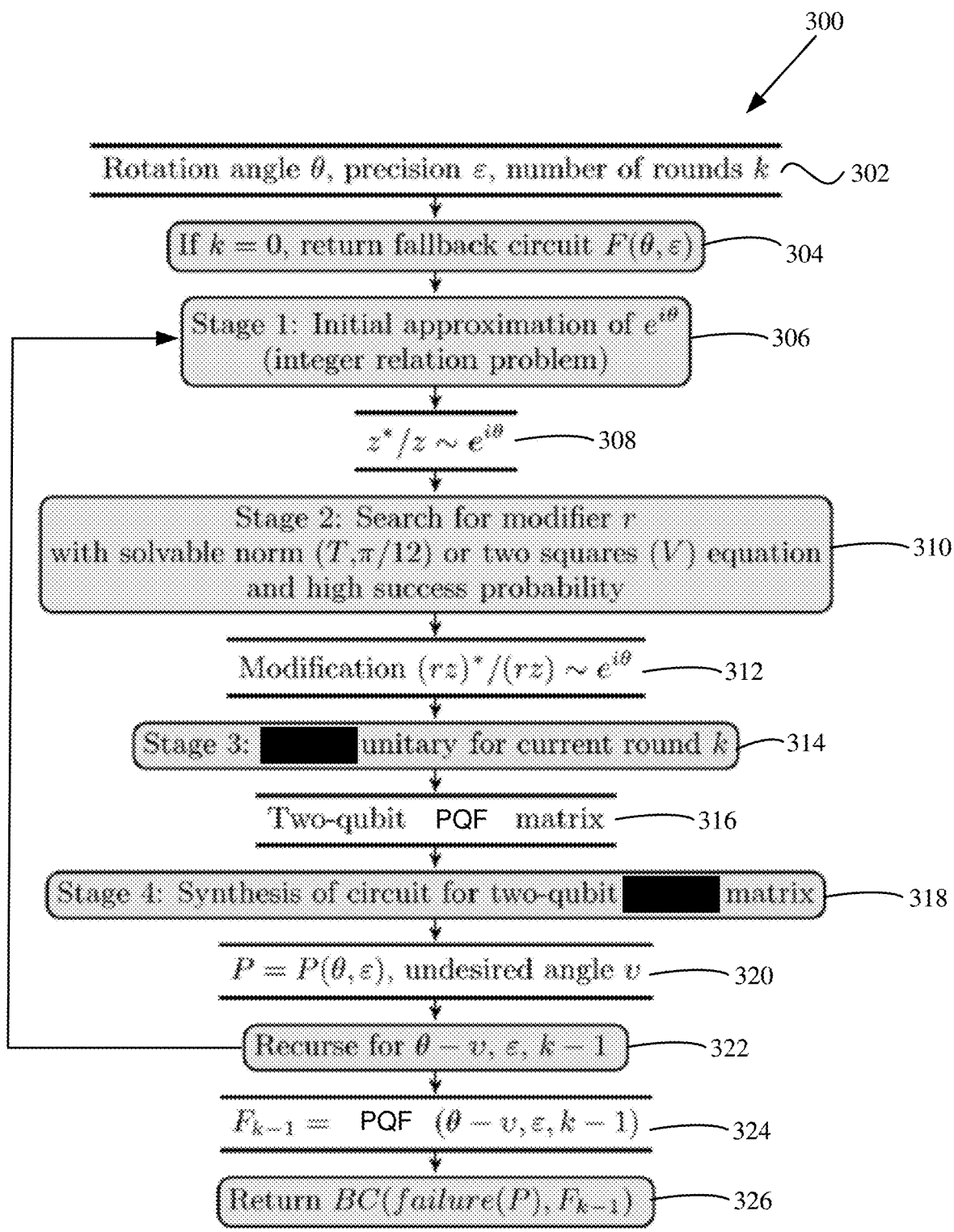
FIG. 3 illustrates a method of defining a PQF circuit in the Clifford+T, Clifford+$\pi/12$, and Clifford+V bases.

A representative compilation method 300 illustrating the above procedure is provided in FIG. 3. At 302, a rotation angle, a precision, and a number of rounds are provided. At 304, if k=0 (the last stage), a fallback circuit is established. Otherwise, at 306, an initial approximation of $e^{i\theta}$ is obtained. At 308, a value of z is obtained such that $z^*/z \sim e^{i\theta}$, wherein $z \in \mathbb{Z}[\omega]$. At 310, a modifier r is found with a solvable norm equation and high success probability. If the gate set is Clifford+T or Clifford+$\pi/12$ then $r \in \mathbb{Z}[\sqrt{2}]$. If the gate set is Clifford+V then $r \in \mathbb{Z}$. In the case of Clifford+V, the initial approximation of $e^{i\theta}$ at 306 can be based on determination of a Gaussian rational number in this basis. The Gaussian rational can be modified to provide for a solvable two squares equation at 310.

At 312, the modifier is used so that $(rz)^*/(rz) \sim e^{i\theta}$. At 314, a PQF circuit is obtained for the current round based on r, z and at 316, a two-qubit PQF matrix is found for the current round. At 318, the PQF is synthesized for the current round. At 320, an undesired angle is determined based on stage failure and at 322, steps 306-320 are repeated for additional rounds (i.e., until k=0). At step 324 a unitary to compensate for the failure in the previous step is computed so that in step 326 another attempt of implementing the overall target gate can be made. At run-time, in case the binary classical control BC in step 326 indicates success, the protocol is terminated at this point as the target unitary G has been correctly implemented. In case the binary classical control indicates failure, the protocol continues with the application of the compensation unitary $F_{k-1}$ which has been precomputed recursively at compile time.

In PQF circuit compilations, a number of stages k is selected so that a sequence of probabilistic sub-circuits is obtained, along with a deterministic fallback circuit. At PQF compile-time, the number of stages k can be determined as a function of the difficulty, or cost, of implementing the stages and the fallback circuit. The method or function used to determine k can be for example minimizing the expected non-Clifford gate count. Alternatively, the number of rounds can be set to the smallest k value for which $q^k C_F < 1$, where $C_F$ is the cost of the fallback circuit and q is the probability of failure. When a PQF circuit is executed with a particular input value, the number of stages that is needed typically depends on the input value. Thus, PQF circuit run-time is a function of the input value and the measurement outcomes. If a given round succeeds, then the remainder of rounds and the fallback circuit will not be executed.

Figure 4:
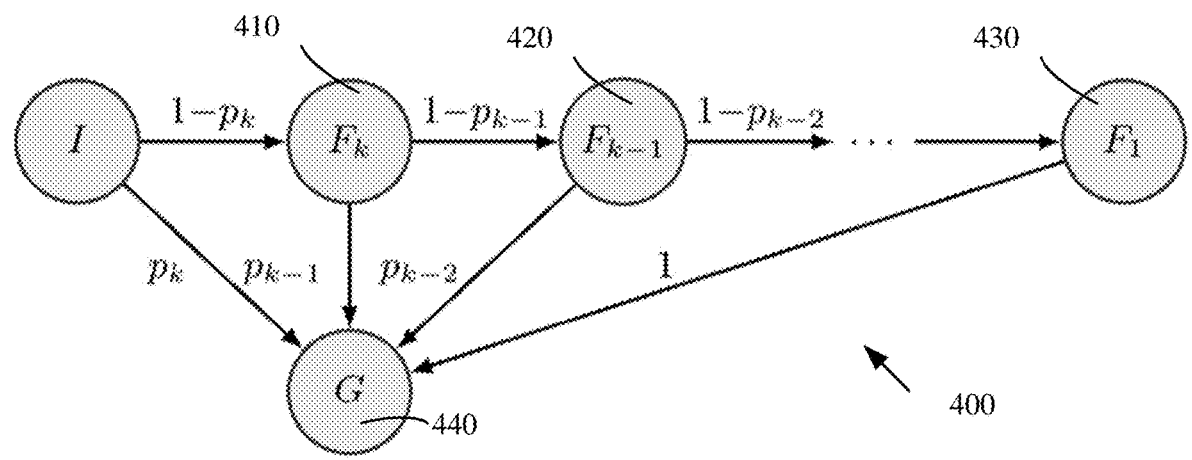
FIG. 4 illustrates a Markov chain of finite length derived from a PQF.

Referring to FIG. 4, a Markov chain 400 is derived from the PQF synthesized by the PQF design method. The nodes of the graph specify the unitary transformations 410-430 $F_k, F_{k-1}, \ldots, F_1$ that are applied to the input state I at each respective round in case the outcome of the measurement was unsuccessful. The overall maximum number k of attempts to implement a target unitary transformation G 440 is fixed before compilation of the circuit using the PQF design method. At execution of the PQF circuit, each transition is probabilistic and is induced by applying a multi-qubit unitary to the primary qubit and at least one ancilla qubit. The probability of success of the jth round is denoted by $p_j$, implying a probability of $1-p_j$ for the unsuccess in the jth round. A unitary $G_j = G_{j-1} F_j^+$ is computed recursively that is used to compensate for the error being made in the jth step.

Figure 5:
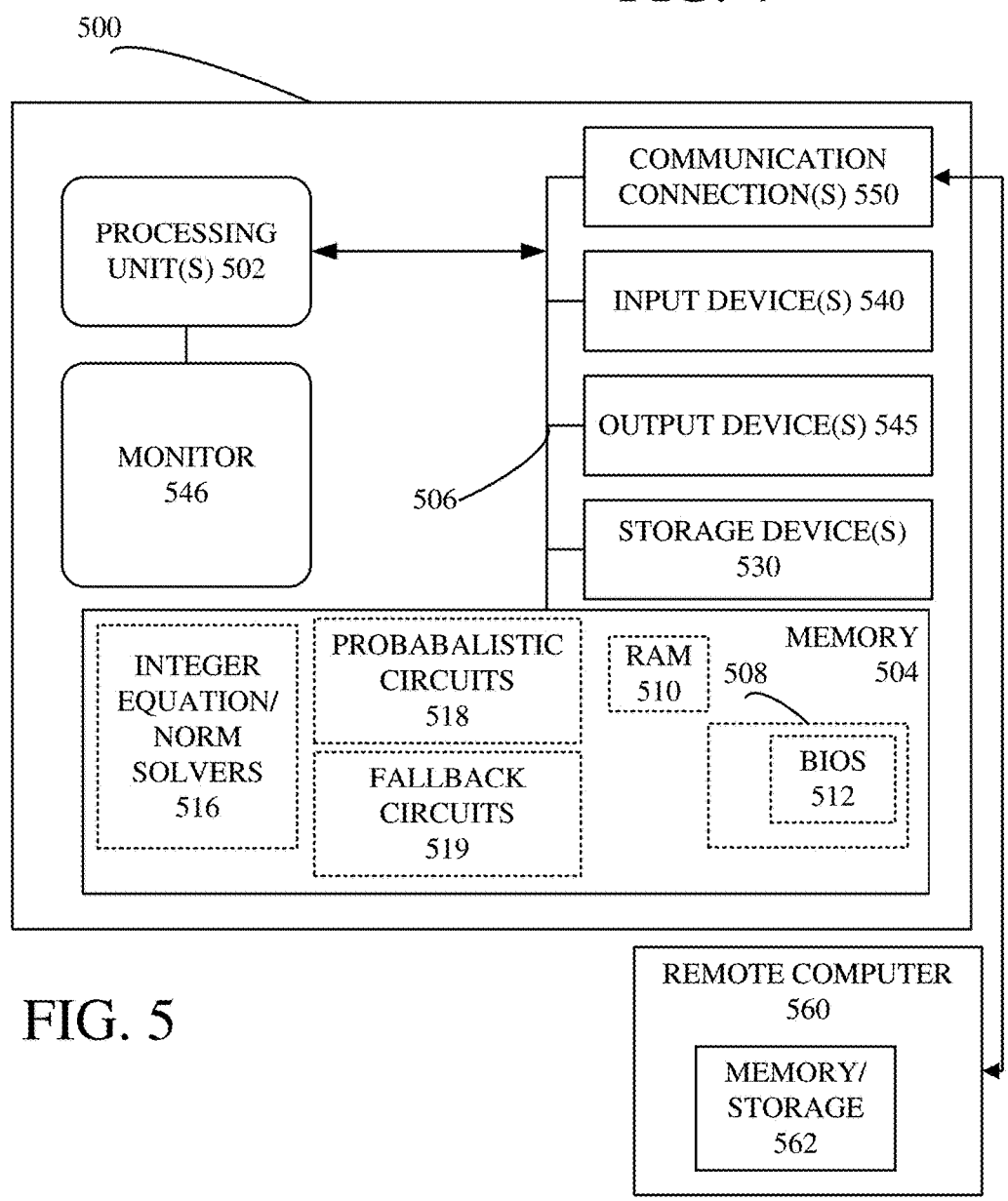
FIG. 5 is a block diagram of a representative computing environment in which the disclosed methods can be implemented.

FIG. 5 and the following discussion are intended to provide a brief, general description of an exemplary computing environment in which the disclosed technology may be implemented. Although not required, the disclosed technology is described in the general context of computer executable instructions, such as program modules, being executed by a personal computer (PC). Generally, program modules include routines, programs, objects, components, data structures, etc., that perform particular tasks or implement particular abstract data types. Moreover, the disclosed technology may be implemented with other computer system configurations, including hand held devices, multiprocessor systems, microprocessor-based or programmable consumer electronics, network PCs, minicomputers, mainframe computers, and the like. The disclosed technology may also be practiced in distributed computing environments where tasks are performed by remote processing devices that are linked through a communications network. In a distributed computing environment, program modules may be located in both local and remote memory storage devices.

With reference to FIG. 5, an exemplary system for implementing the disclosed technology includes a general purpose computing device in the form of an exemplary conventional PC 500, including one or more processing units 502, a system memory 504, and a system bus 506 that couples various system components including the system memory 504 to the one or more processing units 502. The system bus 506 may be any of several types of bus structures including a memory bus or memory controller, a peripheral bus, and a local bus using any of a variety of bus architectures. The exemplary system memory 504 includes read only memory (ROM) 508 and random access memory (RAM) 510. A basic input/output system (BIOS) 512, containing the basic routines that help with the transfer of information between elements within the PC 500, is stored in ROM 508.

As shown in FIG. 5, computer-executable instructions for PQF circuit synthesis are stored in a memory portion 516 and include instructions for, for example, solving integer equations, evaluating and solving norm equations, and deterministic search for determination of r values. In addition, a memory portion 518 stores circuit definitions for circuits that, upon success, implement an approximation to a desired unitary or procedures associated with the disclosed methods. Fallback circuit definition and procedures are stored in a memory portion 519. Computer-executable instructions are also stored for receiving rotation angles and precisions as well as communicating circuit definitions.

The exemplary PC 500 further includes one or more storage devices 530 such as a hard disk drive for reading from and writing to a hard disk, a magnetic disk drive for reading from or writing to a removable magnetic disk, and an optical disk drive for reading from or writing to a removable optical disk (such as a CD-ROM or other optical media). Such storage devices can be connected to the system bus 506 by a hard disk drive interface, a magnetic disk drive interface, and an optical drive interface, respectively. The drives and their associated computer readable media provide nonvolatile storage of computer-readable instructions, data structures, program modules, and other data for the PC 500. Other types of computer-readable media which can store data that is accessible by a PC, such as magnetic cassettes, flash memory cards, digital video disks, CDs, DVDs, RAMs, ROMs, and the like, may also be used in the exemplary operating environment.

A number of program modules may be stored in the storage devices 530 including an operating system, one or more application programs, other program modules, and program data. Storage of quantum syntheses and instructions for obtaining such syntheses can be stored in the storage devices 530 as well as or in addition to the memory 504. A user may enter commands and information into the PC 500 through one or more input devices 540 such as a keyboard and a pointing device such as a mouse. Other input devices may include a digital camera, microphone, joystick, game pad, satellite dish, scanner, or the like. These and other input devices are often connected to the one or more processing units 502 through a serial port interface that is coupled to the system bus 506, but may be connected by other interfaces such as a parallel port, game port, or universal serial bus (USB). A monitor 546 or other type of display device is also connected to the system bus 506 via an interface, such as a video adapter. Other peripheral output devices 545, such as speakers and printers (not shown), may be included. In some cases, a user interface is display so that a user can input a circuit for synthesis, and verify successful synthesis.

The PC 500 may operate in a networked environment using logical connections to one or more remote computers, such as a remote computer 560. In some examples, one or more network or communication connections 550 are included. The remote computer 560 may be another PC, a server, a router, a network PC, or a peer device or other common network node, and typically includes many or all of the elements described above relative to the PC 500, although only a memory storage device 562 has been illustrated in FIG. 5. The personal computer 500 and/or the remote computer 560 can be connected to a local area network (LAN) and a wide area network (WAN). Such networking environments are commonplace in offices, enterprise wide computer networks, intranets, and the Internet.

When used in a LAN networking environment, the PC 500 is connected to the LAN through a network interface. When used in a WAN networking environment, the PC 500 typically includes a modem or other means for establishing communications over the WAN, such as the Internet. In a networked environment, program modules depicted relative to the personal computer 500, or portions thereof, may be stored in the remote memory storage device or other locations on the LAN or WAN. The network connections shown are exemplary, and other means of establishing a communications link between the computers may be used.

Figure 6:
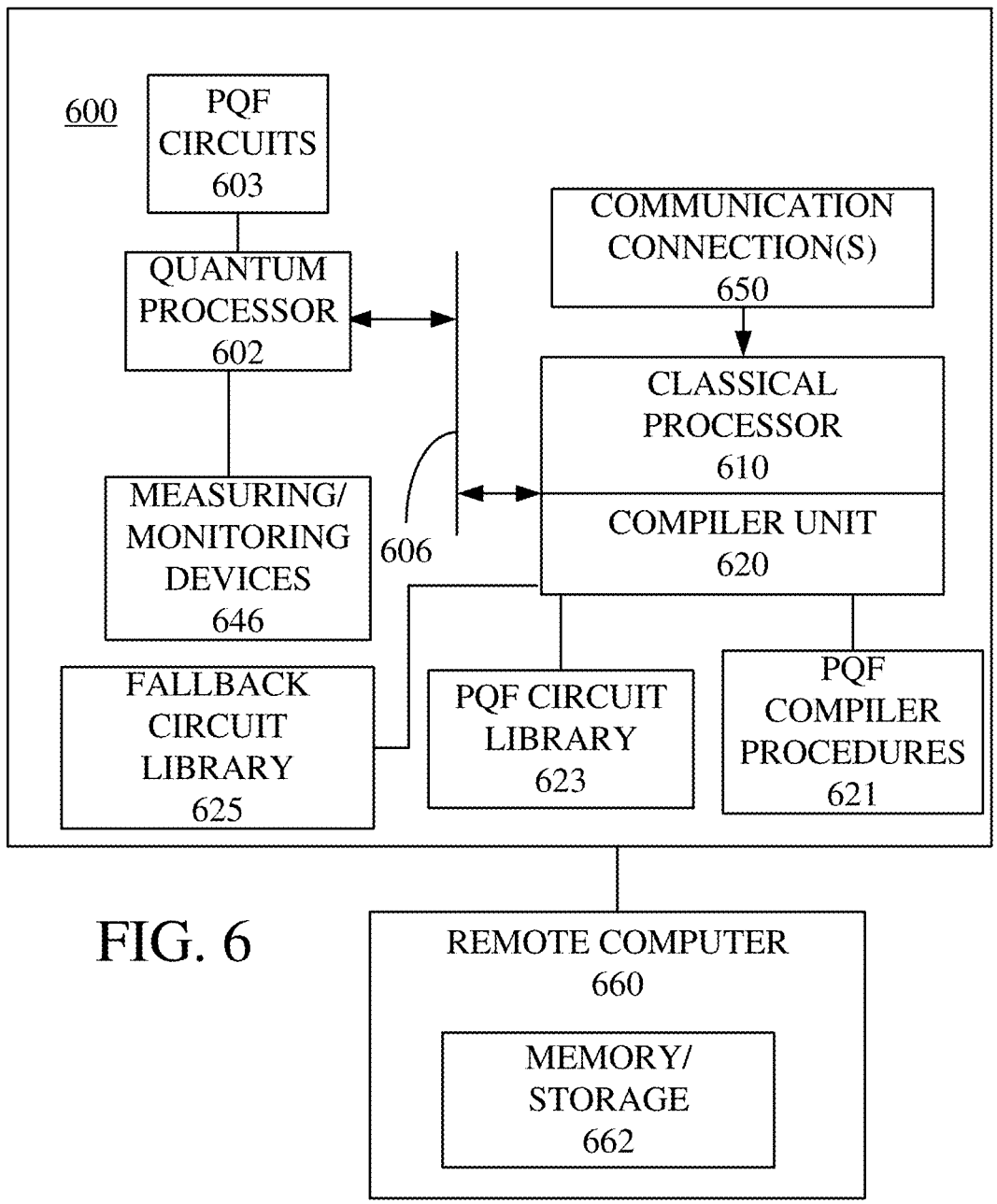
FIG. 6 is a block diagram of a representative computing environment that includes classical and quantum processing.

With reference to FIG. 6, an exemplary system for implementing the disclosed technology includes computing environment 600, where compilation into braid pattern circuits is separated from the quantum processing that consumes the compiled circuits. The environment includes a quantum processing unit 602 and one or more monitoring/measuring device(s) 646 and fallback circuit library 625. The quantum processor executes quantum circuits that are precompiled by classical compiler unit 620 utilizing one or more classical processor(s) 610. The precompiled quantum circuits such as PQF circuits 603 are downloaded and the instruction set is communicated to the qubits via a bus 606.

With reference to FIG. 6, the compilation is the process of translation of a high-level description of a quantum algorithm into a sequence of quantum circuits. Such high-level description may be stored, as the case may be, on one or more external computer(s) 660 outside the computing environment 600 utilizing one or more memory and/or storage device(s) 662, then downloaded as necessary into the computing environment 600 via one or more communication connection(s) 650. Alternatively, the classical compiler unit 620 is coupled to a classical processor 610 and a PQF compiler procedure library 621 that contains some or all procedures necessary to implement the methods described above as well as a PQF circuit library 623 that stores compiled circuits.

Having described and illustrated the principles of our invention with reference to the illustrated embodiments, it will be recognized that the illustrated embodiments can be modified in arrangement and detail without departing from such principles. For instance, elements of the illustrated embodiment shown in software may be implemented in hardware and vice-versa. Also, the technologies from any example can be combined with the technologies described in any one or more of the other examples. Alternatives specifically addressed in these sections are merely exemplary and do not constitute all possible embodiments.

The invention claimed is:

1. A computer-implemented method, comprising:
with a computer:
establishing a first approximation of a target unitary to a requested precision;
expanding the first approximation into a first multi-qubit unitary that implements the target unitary in a selected basis upon successful measurement;
defining a fallback circuit in the selected basis, wherein the fallback circuit implements the target unitary based upon an unsuccessful measurement;
storing a circuit definition that includes a definition of the first multi-qubit unitary and a definition of the fallback circuit in a computer-readable storage device; and
implementing a quantum circuit that includes the fallback circuit and a circuit implementing the first multi-qubit unitary.

2. The computer-implemented method of claim 1, wherein the target unitary is a multi-qubit unitary, and further comprising:
establishing a second approximation of the target unitary to a requested precision based on an unsuccessful output of the first multi-qubit unitary; and
expanding the second approximation into a second multi-qubit unitary that implements the target unitary in the selected basis upon successful measurement, wherein the fallback circuit implements the target unitary based upon an unsuccessful measurement associated with the second multi-qubit unitary.

3. The computer-implemented method of claim 2, wherein the target unitary is of the form $$\frac{1}{\sqrt{2}^L}\begin{pmatrix} rz & y \\ -y^* & r^*z^* \end{pmatrix},$$

wherein z is a cyclotomic rational, r is a probability enhancement factor, and L is a minimal positive integer such that $2^L > |r\,z|^2$.

4. The computer-implemented method of claim 3, further comprising selecting a value $r \in Z[\sqrt{2}]$ such that a norm equation is solvable for z replaced by rz.

5. The computer-implemented method of claim 1, further comprising:
establishing a series of approximations of the target unitary to a requested precision based on an unsuccessful measurement of a multi-qubit unitary associated with a prior approximation in the series; and
expanding the series of approximations into a corresponding series of multi-qubit unitaries that implement the target unitary in the selected basis upon successful measurement, wherein the fallback circuit implements the target unitary based upon an unsuccessful measurement associated with a final multi-qubit unitary in the series.

6. The computer-implemented method of claim 1, wherein the approximation of the target unitary is based on a rational cyclotomic approximation of the target unitary.

7. The computer-implemented method of claim 6, further comprising establishing the rational cyclotomic approximation of the target unitary by solving a norm equation.

8. The computer-implemented method of claim 1, wherein the target unitary is an axial rotation and is approximated by $z^*/z$ wherein z is a cyclotomic integer.

9. The computer-implemented method of claim 1, wherein the multi-qubit unitary is defined with respect to at least one ancillary qubit and at least one primary qubit.

10. The computer-implemented method of claim 1, wherein the first multi-qubit unitary is coupled to at least one ancillary qubit having a predetermined state.

11. The computer-implemented method of claim 10, wherein the at least one ancillary qubit is used in each of a plurality of probabilistic quantum circuits with fallback (PQF) stages associated with different multi-qubit unitaries and measurements associated with at least one of the PQF stages.

* * * * *